(12) United States Patent
Chen

(10) Patent No.: US 12,140,768 B2
(45) Date of Patent: Nov. 12, 2024

(54) AUGMENTED REALITY HEAD-MOUNTED DISPLAY

(71) Applicant: HJY Forward Medical Investment Co., Ltd., Ebene (MU)

(72) Inventor: John Jiannyuh Chen, Seattle, WA (US)

(73) Assignee: HJY Forward Medical Investment Co., Ltd., Ebene (MU)

( * ) Notice: Subject to any disclaimer, the term of this patent is extended or adjusted under 35 U.S.C. 154(b) by 333 days.

(21) Appl. No.: 17/723,248

(22) Filed: Apr. 18, 2022

(65) Prior Publication Data

US 2023/0236427 A1 Jul. 27, 2023

(30) Foreign Application Priority Data

Jan. 24, 2022 (TW) .................................. 111200960

(51) Int. Cl.
| | |
|---|---|
| *G02B 27/01* | (2006.01) |
| *G06F 1/16* | (2006.01) |
| *G06F 3/01* | (2006.01) |
| *H05K 5/00* | (2006.01) |

(52) U.S. Cl.
CPC ....... *G02B 27/0176* (2013.01); *G02B 27/017* (2013.01); *G02B 27/0172* (2013.01); *G06F 1/163* (2013.01); *G06F 3/011* (2013.01); *H05K 5/0017* (2013.01)

(58) Field of Classification Search
CPC .......... G06F 1/163; G06F 3/012; G06F 3/011; G02B 27/0176; G02B 27/017; G02B 2027/0169; G02B 2027/0161; G02B 27/0172; G02B 27/04; G02B 2027/0159; G02B 2027/0154; G02B 7/021; F16M 13/04
See application file for complete search history.

(56) References Cited

U.S. PATENT DOCUMENTS

| | | | |
|---|---|---|---|
| 2002/0118506 A1* | 8/2002 | Saito ....................... G06F 1/163 |
| | | | 361/679.03 |
| 2017/0017085 A1* | 1/2017 | Araki .................... G02B 27/028 |
| 2017/0094816 A1* | 3/2017 | Yun ....................... H05K 5/0013 |
| 2017/0337737 A1* | 11/2017 | Edwards ................ F16M 13/04 |
| 2018/0364491 A1* | 12/2018 | Park .................... G02B 27/0176 |
| 2019/0324280 A1* | 10/2019 | Yildiz ................. G02B 27/0176 |
| 2020/0159028 A1* | 5/2020 | Araki .................... H04R 1/1016 |
| 2020/0278556 A1* | 9/2020 | Chae ........................ G06F 3/011 |
| 2021/0080996 A1* | 3/2021 | Hudman ................ A42B 3/042 |

(Continued)

*Primary Examiner* — Dismery Mercedes

(57) ABSTRACT

An augmented reality (AR) head-mounted display suitable for use with an endoscope to display the images captured by the endoscope in front of a doctor in an augmented reality manner. The AR head-mounted display utilizes a forehead pad that is raised and tilted at a larger angle to match a rear-head pad that is at the eye level of the wearer and is tilted at a smaller angle. The connection cable of the AR head-mounted display is extending to and clamped on a clip structure of the rear-head pad, and then further extending downward from the back of the wearer. No matter whether the wearer is in a straight-up or head-down position, such head-mount design can always be ergonomically and stably held on the wearer's head; there will be no loosening nor displacement even if the wearer's head is lowered for a long time.

4 Claims, 10 Drawing Sheets

(56) References Cited

U.S. PATENT DOCUMENTS

2021/0216099 A1* 7/2021 Goodner ............... G06F 1/163
2022/0187609 A1* 6/2022 Snyder ............... G02B 27/0176
2024/0111163 A1* 4/2024 Law ................... G06F 1/163

* cited by examiner

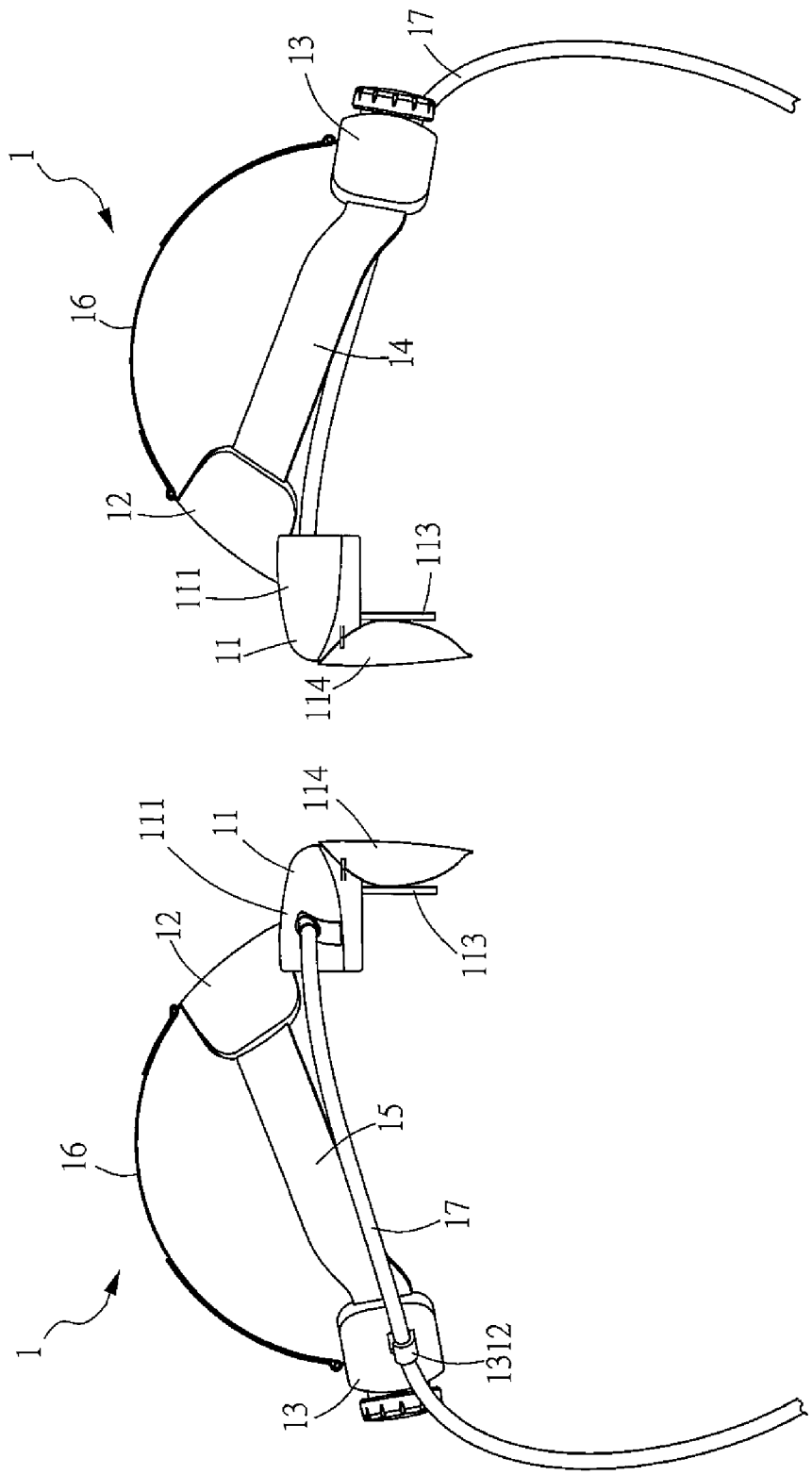

AUGMENTED REALITY HEAD-MOUNTED DISPLAY

BACKGROUND OF INVENTION

1. Field of the Invention

The invention refers to an augmented reality (AR) head-mounted display, which can be used with an endoscope in order to display the images captured by the endoscope in front of a doctor in an augmented reality manner.

2. Description of the Prior Art

In recent years, head-mounted displaying devices equipped with technologies such as Virtual Reality (VR), Augmented Reality (AR), or Mixed Reality (MR) have been widely developed and used in computer games, social communities, commercial business or entertainments. Because in the computer game, social community, commercial business or entertainment activities, most of the people usually look straight at the eye-level for a relative long time, swing their heads from side to side, and nod their heads up and down slightly; therefore, these existing head-mounted displaying devices are also designed for the purpose of being suitable for long-term straight-looking operation and swinging their heads from side to side.

Recently, there are also medical practitioners trying to develop technologies to use head-mounted displaying devices for endoscopic surgeries. The images of the internal tissues or organs of the human body captured by the endoscope can be displayed on the head-mounted displaying device worn by the surgeon in the form of virtual reality or augmented reality, which enables surgeons to perform endoscopic surgical procedures with greater ease and precision. However, because surgeon needs to bow his/her head for a long time when performing endoscopic surgery, according to the structural design of the existing head-mounted displaying device, the head-mounted displaying device is prone to loosening and displacement if the wearer keeps his/her head down for a long time. And thus, there is a need for further improvements.

The present invention provides a novel head-mount design of an augmented reality (AR) head-mounted display. When the AR head-mounted display is worn on a wearer's head, there will be no loosening nor displacement even if the wearer's head is lowered for a long time, which is especially suitable for surgeons to wear to perform endoscopic surgery.

SUMMARY OF THE INVENTION

The primary objective of the present invention is to provide an augmented reality (AR) head-mounted display, which can be used with an endoscope in order to display the images captured by the endoscope in front of a doctor in an augmented reality manner. When the AR head-mounted display is worn on a doctor's head, there will be no loosening nor displacement even if the doctor's head is lowered for a long time, which is especially suitable for surgeons to wear to perform endoscopic surgery.

In order to achieve the aforementioned objective, the present invention provides an augmented reality head-mounted display comprising:

an augmented reality (AR) displaying device, said AR displaying device comprising: a casing, an optical display module, two transparent projection panels (also called as waveguides) and a dark transparent cover (also called as visor); the optical display module being accommodated in the casing for projecting images; said casing being made of hard material; the two transparent projection panels extending downward from a bottom surface of the casing, such that the images projected by the optical display module can be displayed on the two transparent projection panels; the dark transparent cover extending downward from a bottom edge of a front side of the casing to a location lower than bottom edges of the two transparent projection panels and being separated from the two transparent projection panels by a distance;

a forehead pad, connected to the AR displaying device; the forehead pad comprising a front cover, a front positioning plate, a front buckle and a front cushion; the front cover being made of hard material; a lower end of the front cover being fixed to a top edge of a rear side of the casing; the front positioning plate being fixed to an inner side of the front cover; a plurality of front ventilation holes being formed on the front positioning plate; the front buckle being positioned in a top notch of the front positioning plate; a top of the front buckle being exposed outside a top edge of the forehead pad; the front cushion being made of soft material and fixed to a rear side of the front cover; the front positioning plate being sandwiched between the front cushion and the front cover;

a rear-head pad, comprising a rear cover, a rear positioning plate, a rear buckle, a rear cushion, and an adjusting mechanism; the rear cover being made of hard material and having a shaft hole; the rear positioning plate being fixed to a front side of the rear cover; a plurality of rear ventilation holes being formed on the rear positioning plate; the rear buckle being located in a top notch of the rear positioning plate; a top of the rear buckle being exposed outside a top edge of the rear-head pad; the rear cushion being made of soft material and fixed to the front side of the rear cover; the rear positioning plate being sandwiched between the rear cushion and the rear cover;

a left strap, being made of hard and flexible material, and connected between a left end of the forehead pad and a left end of the rear-head pad; a left slot extending laterally being disposed in an area of the left strap that is closer to the rear-head pad;

a right strap, being made of hard and flexible material, and connected between a right end of the forehead pad and a right end of the rear-head pad; a right slot extending laterally being disposed in an area of the right strap that is closer to the rear-head pad; and an upper strap, being made of flexible material and connected between the front buckle exposed on the top edge of the forehead pad and the rear buckle exposed on the top edge of the rear-head pad;

wherein the adjusting mechanism comprises: a lower rack, an upper rack, a gear, and a knob; the lower rack is disposed in one of the left slot and the right slot, while the upper rack is disposed in the other one of the left slot and the right slot; the lower rack and the upper rack are located inside the rear-head pad and between the rear cover and the rear positioning plate; the gear is located inside the rear-head pad, and is located between the rear cover and the rear positioning plate, and is located in both the left slot and the right slot, and is engaged with both the lower rack and the upper rack; the gear has a protruding shaft, the shaft passes through the shaft hole of the rear cover and protrudes out of the rear cover; the knob is located outside the rear cover and is fixed to the shaft; when the knob is rotated, the shaft and the gear can be driven to rotate synchronously, thereby driving the lower rack and the upper rack engaged with the gear to move laterally; such that, the left strap and the right strap are driven to perform either an inward shortening motion or an outward extending motion.

In a preferred embodiment, the casing, the front cover, the front positioning plate, the rear cover, the rear positioning plate, the left strap, the right strap, the gears and the knob are all made of hard plastic; the upper strap is made of either soft plastic or non-woven fabric, and hook and loop fasteners are provided on front and rear ends of the upper strap; such that, the front end and rear end of the upper strap can pass through the front buckle and the rear buckle respectively and then be pasted and fixed by means of the hook and loop fasteners thereon; a front end of the left strap is combined with a left side of the front positioning plate, and a rear end of the left strap is engaged with the gear by one of the lower rack or the upper rack; a front end of the right strap is combined with a right side of the front positioning plate, and a rear end of the right strap is engaged with the gear by the other one of the lower rack or the upper rack.

In a preferred embodiment, the augmented reality head-mounted display further comprises a connecting cable; wherein, a clip structure is further provided on a side portion of the rear cover of the rear-head pad; a front end of the cable is connected to a side surface of the casing and is electrically connected to the optical display module; a rear end of the cable extends to the rear-head pad and is clamped on the clip structure of the rear cover and then continues to extend downward; wherein, except that the cable is connected to the side surface of the casing and the clip structure of the rear cover, the cable is not connected to any other component of the augmented reality head-mounted display.

In a preferred embodiment, when the augmented reality head-mounted display is adapted to be worn on a human head, the forehead pad and the rear-head pad are adapted to be respectively abutted against and supported on a forehead portion and a rear-head portion of the human head; in addition, the left strap, the right strap and the upper strap are adapted to be respectively abutted on a left side, a right side and a top surface of the human head; and moreover, the casing of the augmented reality displaying device does not touch the human head at all.

In a preferred embodiment, when the augmented reality head-mounted display is adapted to be worn on the human head, an X-axis extending horizontally is defined according to centers of two eyes of the human head; a Y-axis extending horizontally and a Z-axis extending vertically are defined according to the X-axis; the X-axis, the Y-axis and the Z-axis are perpendicular to each other; a first plane defined by the X-axis and the Z-axis is called an XZ plane, a second plane defined by the X-axis and the Y-axis is called an XY plane, and a third plane defined by the Y-axis and the Z-axis is called a YZ plane; the two transparent projection panels are substantially parallel to the XZ plane; a first included angle between a tangent line defined by a center point A of a front surface of the front cover on the YZ plane and the Z axis is $\theta 1$; a second included angle between the tangent line defined by a center point B of a rear surface of the rear cover on the YZ plane and the Z axis is $\theta 2$; a third included angle between an extension line defined by the center point A of the front surface of the front cover and the center point B of the rear surface of the rear cover on the YZ plane and the Y axis is $\theta 3$; a first distance in the Z-axis direction between the center point A of the front surface of the front cover and the center point B of the rear surface of the rear cover on the YZ plane is h; a second distance in the Y-axis direction between the two transparent projection panels and surfaces of the two eyes of the human head on the YZ plane is d; wherein, $30°\leq\theta 1\leq 45°$; $10°\leq\theta 2\leq 20°$; $20°\leq\theta 3\leq 30°$; 65 mm$\leq$h$\leq$105 mm; 15 mm$\leq$d$\leq$25 mm.

In a preferred embodiment, when the augmented reality head-mounted display is adapted to be worn on the human head, the two transparent projection panels, the two eyes of the human head, and the center point B of the rear surface of the rear cover are substantially located at the same height in the Z-axis direction.

BRIEF DESCRIPTION OF THE DRAWINGS

FIG. 2A to FIG. 2F are the front, rear, right, left, top and bottom views of the AR head-mounted display of the present invention, respectively;

DESCRIPTION OF THE PREFERRED EMBODIMENT

The present invention refers to an augmented reality (AR) head-mounted display, which can be used with an endoscope in order to display the images captured by the endoscope in front of a doctor in an augmented reality manner. The AR head-mounted display utilizes a forehead pad that is raised and tilted at a larger angle to match a rear-head pad that is at the eye level of the wearer and is tilted at a smaller angle. In addition, the connection cable of the AR head-mounted display is extending to and clamped on a clip structure of the rear-head pad, and then further extending downward from the back of the wearer. No matter whether the wearer is in a straight-up or head-down position, this novel head-mounted design can always be ergonomically and stably held on the wearer's head; there will be no loosening nor displacement even if the wearer's head is lowered for a long time, which is especially suitable for surgeons to wear to perform endoscopic surgery. Moreover, the cable extends from the front of the AR head-mounted display to the back of the wearer by means of the clip structure formed on the rear-head pad, such that the cable is not bonded nor connected to any other component of the AR head-mounted display. Thus, the cable will not interfere with the wearer's hand movements or walking movements, nor will the head-mounted display tilt or shift due to the weight of the cable itself or being pulled.

In order to more clearly illustrate the AR head-mounted display proposed by the present invention, the following will be described in detail with the accompanying drawings.

Figure 1:
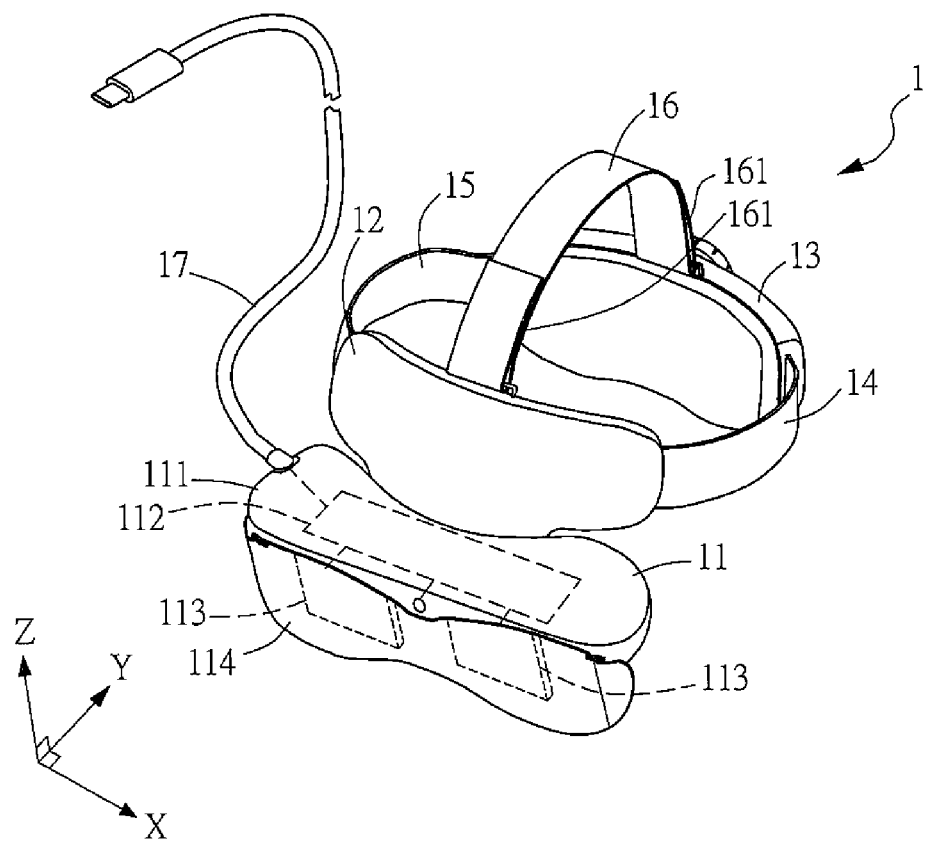
FIG. 1 is a perspective view of the AR head-mounted display of the present invention.
Figure 2B:
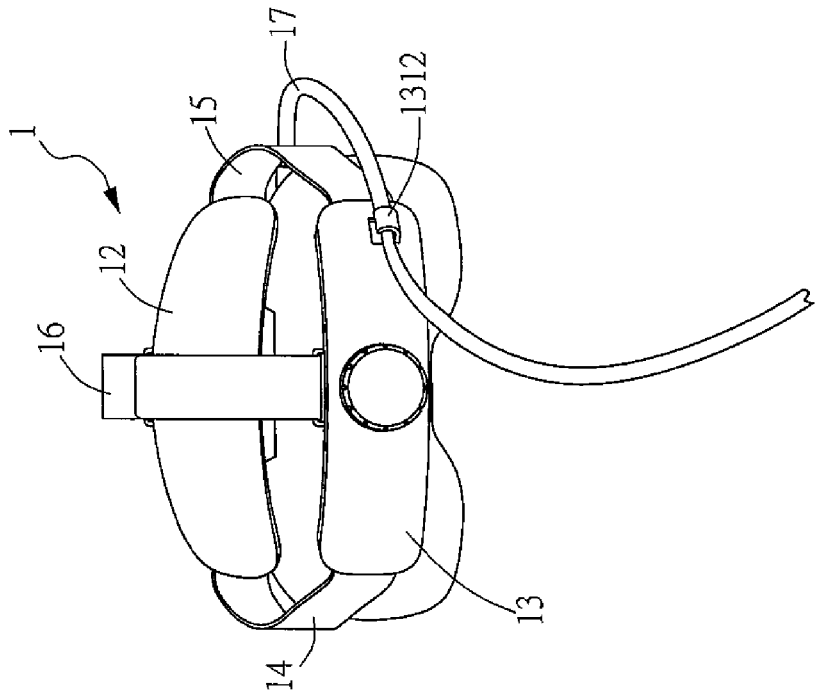
Figure 2A:
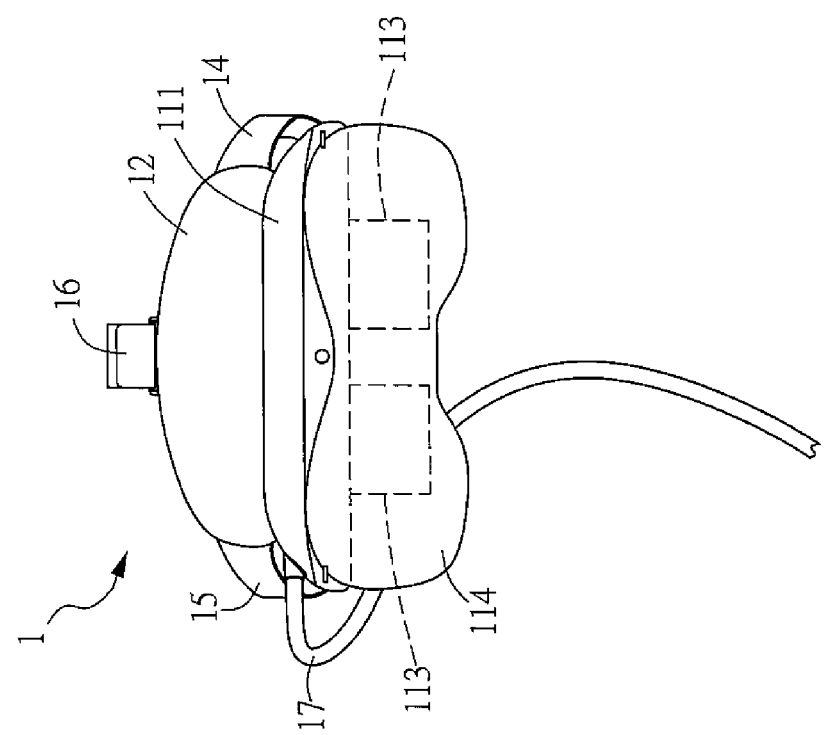
Figure 2E:
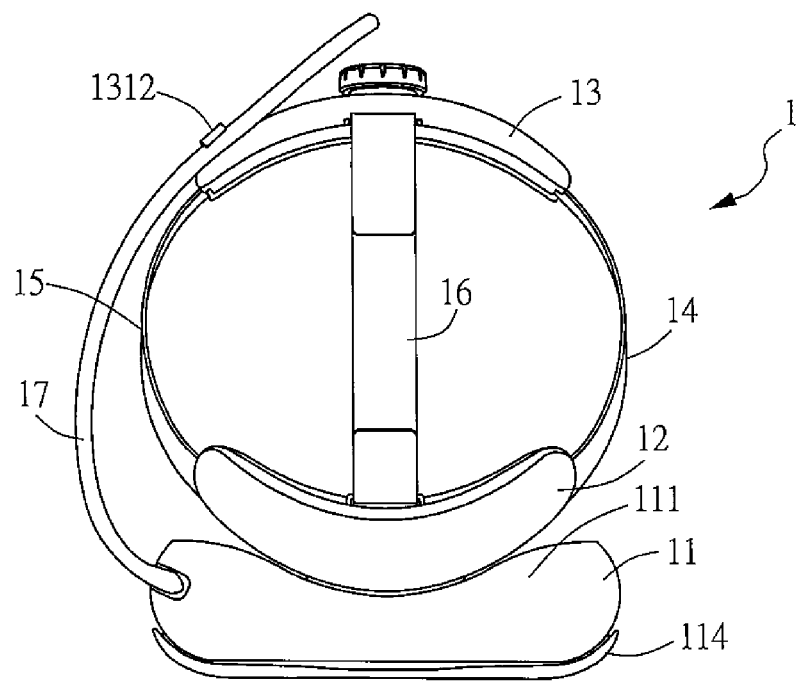
Figure 2F:
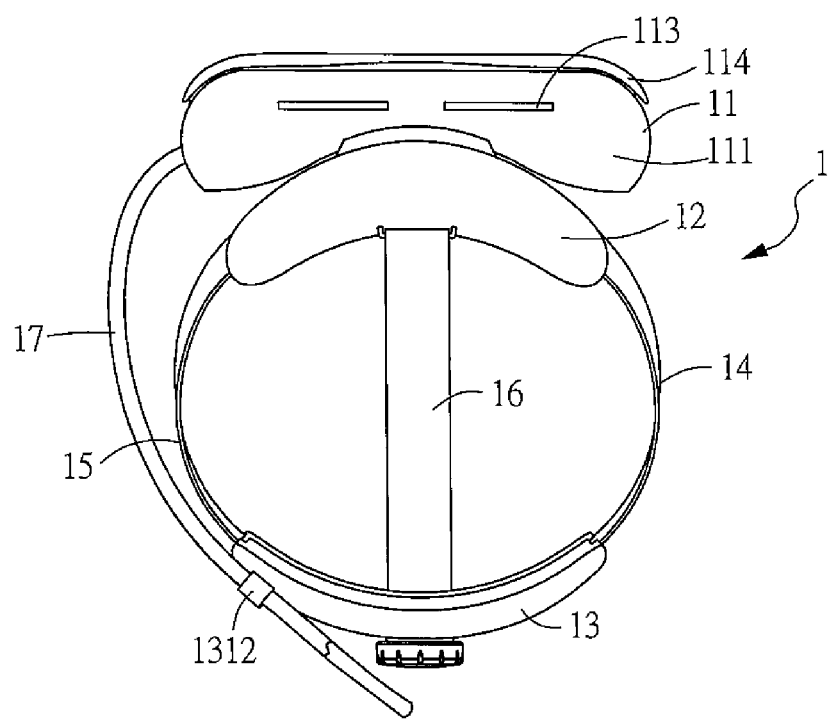
Figure 3:
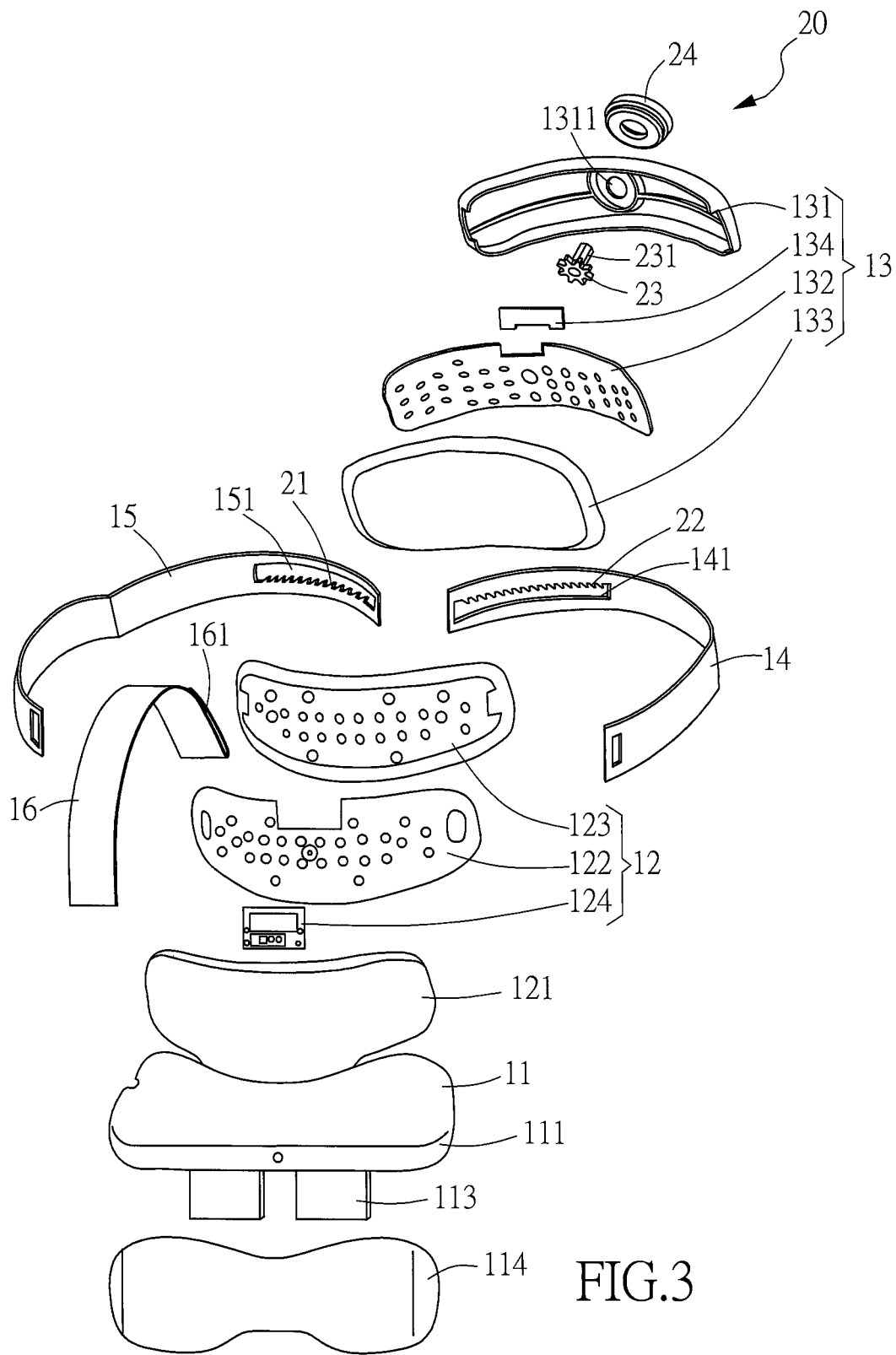
FIG. 3 is an exploded view of the main components of the AR head-mounted display of the present invention.
Figure 4:
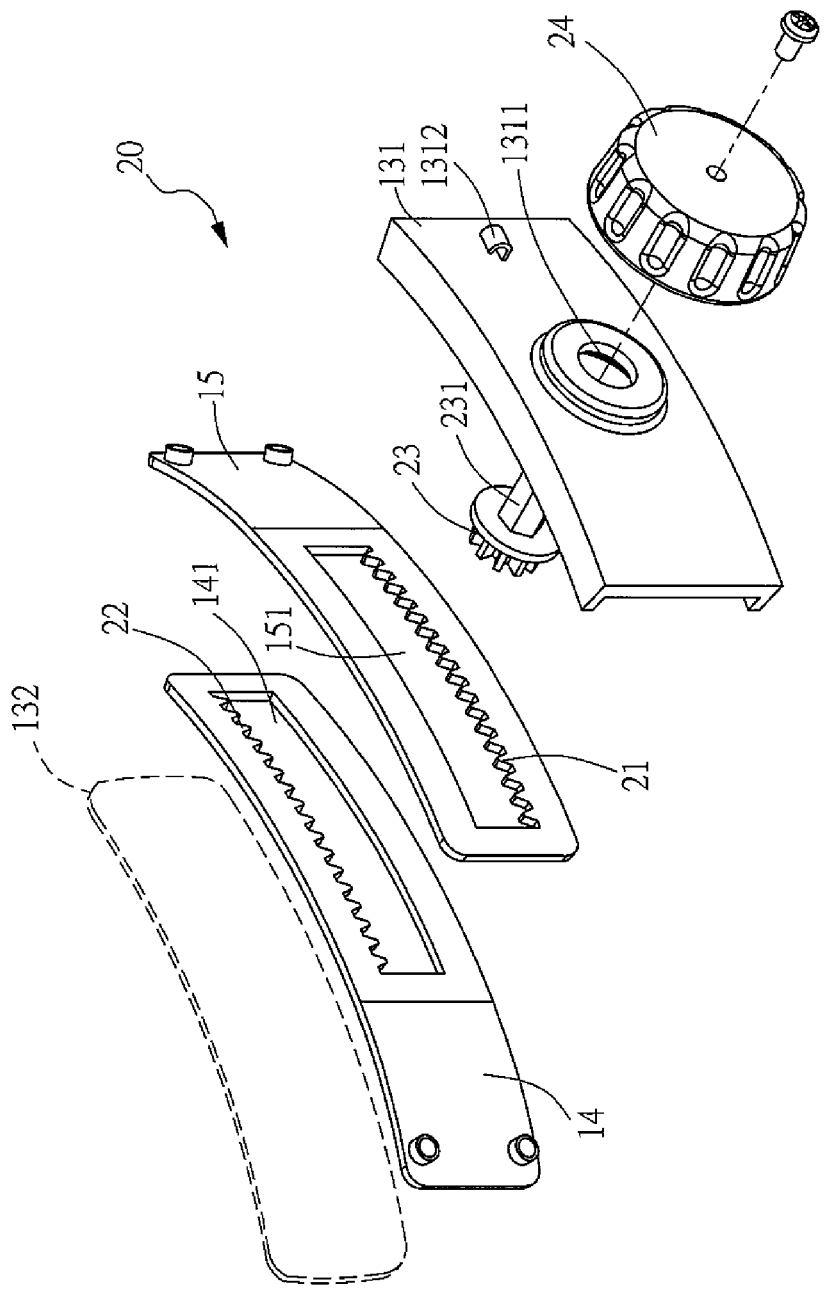
FIG. 4 is an exploded view of the components of the adjusting mechanism in the AR head-mounted display of the present invention.
Figure 5A:
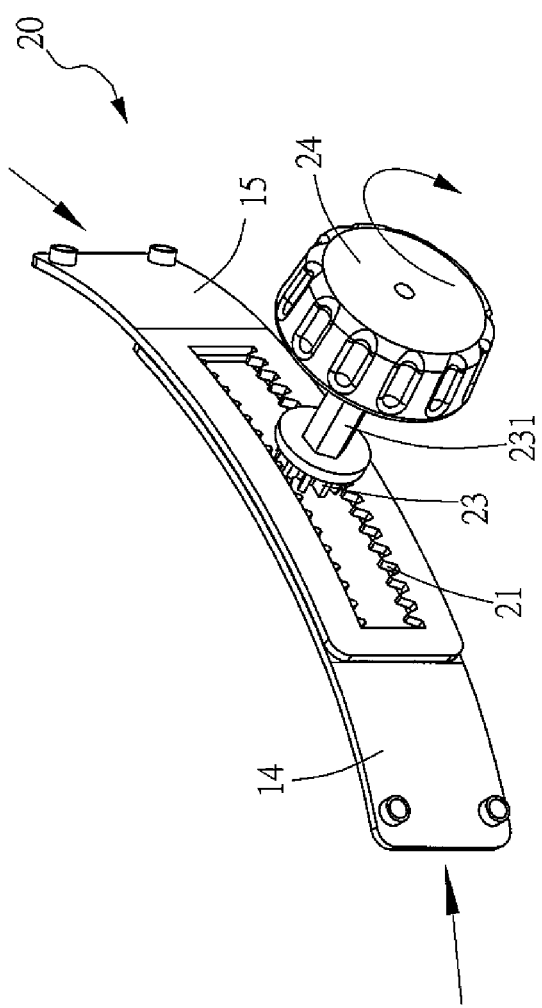
FIG. 5A and FIG. 5B are schematic diagrams of two operations of the adjusting mechanism in the AR head-mounted display of the present invention, respectively.
Figure 5B:
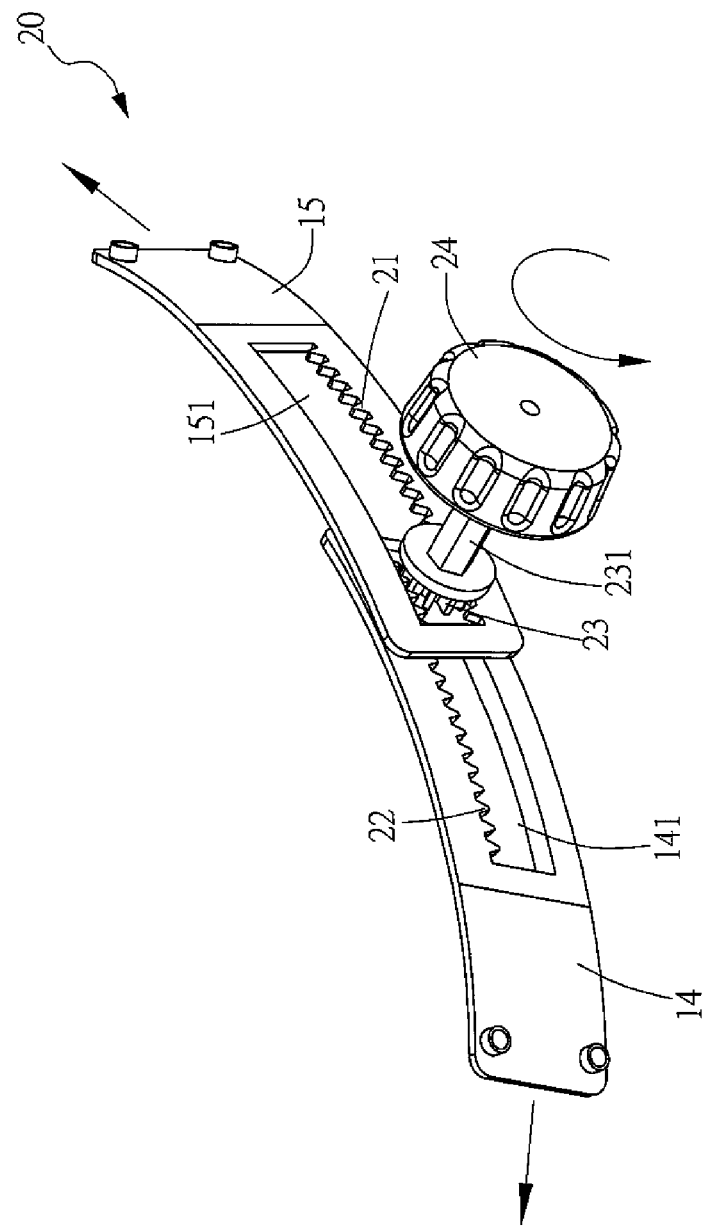
Figure 6:
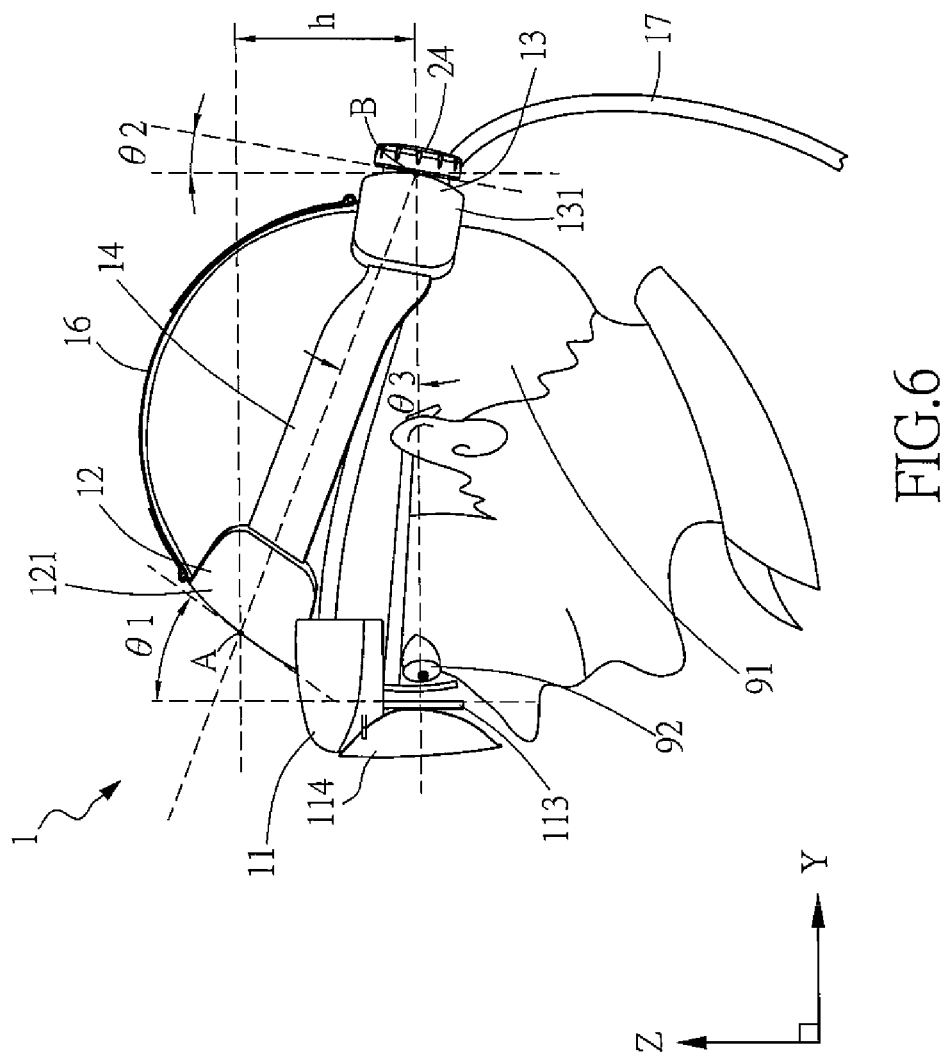
FIG. 6 is a schematic diagram of the AR head-mounted display of the present invention when worn on the head of a human body.
Figure 7:
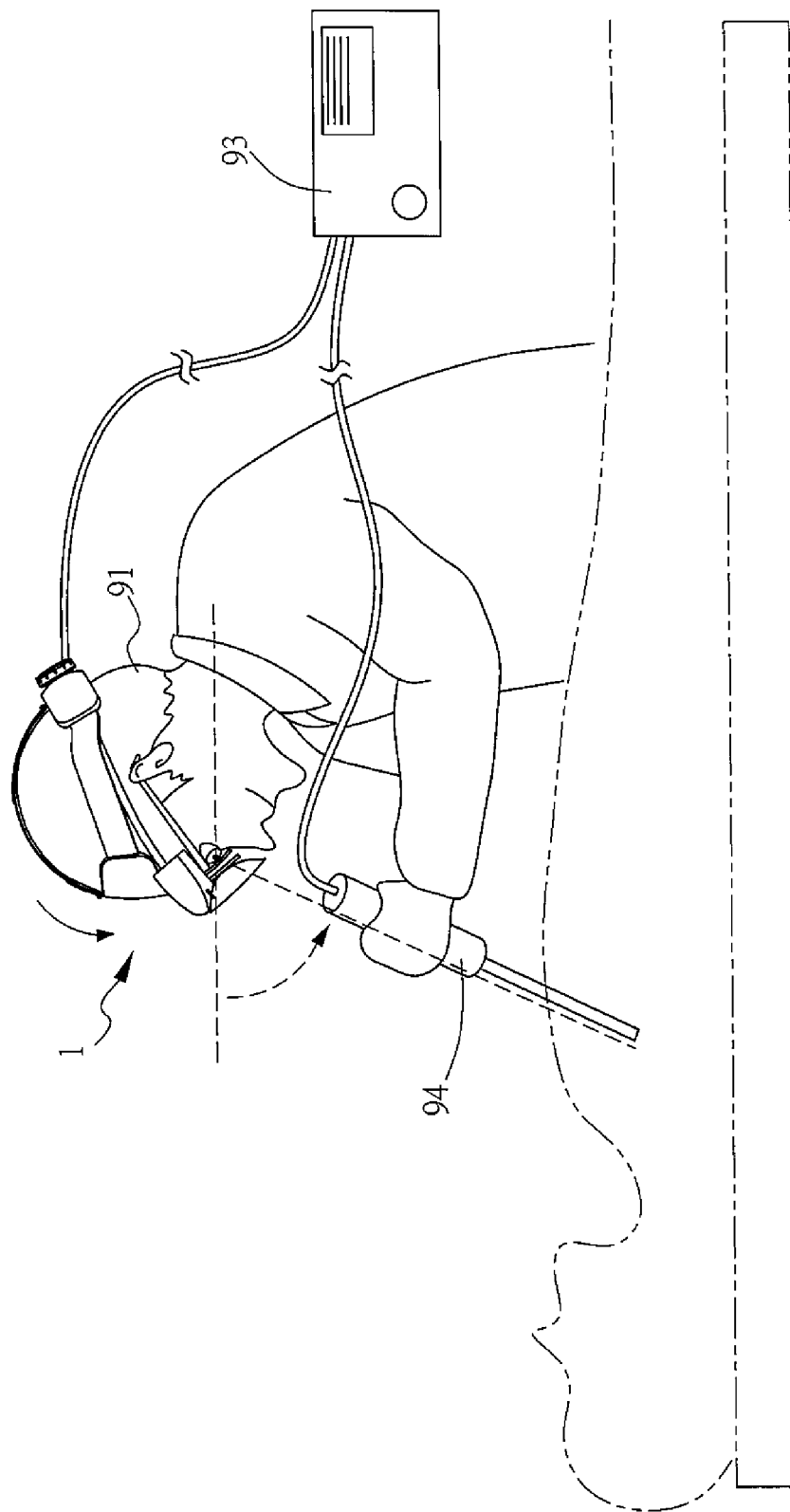
FIG. 7 is a schematic diagram of an embodiment of the AR head-mounted display of the present invention applied to endoscopic surgery.

FIG. 1 to FIG. 7 disclose a preferred embodiment of the augmented reality (AR) head-mounted display of the present invention. Wherein, FIG. 1 is a perspective view of the AR head-mounted display of the present invention; FIG. 2A to FIG. 2F are the front, rear, right, left, top and bottom views of the AR head-mounted display of the present invention, respectively; FIG. 3 is an exploded view of the main components of the AR head-mounted display of the present invention; FIG. 4 is an exploded view of the components of the adjusting mechanism in the AR head-mounted display of the present invention; FIG. 5A and FIG. 5B are schematic diagrams of two operations of the adjusting mechanism in the AR head-mounted display of the present invention, respectively; FIG. 6 is a schematic diagram of the AR head-mounted display of the present invention when worn on the head of a human body; FIG. 7 is a schematic diagram of an embodiment of the AR head-mounted display of the present invention applied to endoscopic surgery.

As shown in FIG. 1, FIG. 2A to FIG. 2F, and FIG. 3, the AR head-mounted display 1 of the present invention mainly comprises: an AR displaying device 11, a forehead pad 12, a rear-head pad 13, a left strap 14, a right strap 15, an upper strap 16, and a connecting cable 17.

The AR displaying device 11 comprises a casing 111, an optical display module 112, two transparent projection panels 113 (also called as waveguides), and a dark transparent cover 114 (also called as visor). The optical display module 112 includes a Digital Light Processing (DLP) projection module (also called as optical engine), which is accommodated in the casing 111 and is used for projecting and playing images. Since the DLP projection module of the optical display module 112 of the present invention can be chosen from the known technologies in the art, the details thereof will not be described. The casing 111 is made of hard material. The two transparent projection panels 113 are positioned to correspond to the wearer's eyes, and extend vertically downward from a bottom surface of the casing 111, so that the images projected and played by the optical display module 112 can be displayed on the two transparent projection panels 113. The dark transparent cover 114 extends downward from the bottom edge of a front side of the casing 111 to a location lower than the bottom edges of the two transparent projection panels 113 and is separated from the two transparent projection panels 113 by a distance. In this embodiment, the light transmittance of the dark transparent cover 114 is between 20% and 80%; such that, when the wearer of the AR head-mounted display 1 of the present invention watches the images projected on the two transparent projection panels 113 by the optical display module 112, in addition to being used as a dark background to make the images on the two transparent projection panels 113 clearer, the dark transparent cover 114 can also allow the eyes of the wearer to see the images of external objects through both the two transparent projection panels 113 and the dark transparent cover 114, so as to achieve the display function of Augmented Reality (AR).

The forehead pad 12 is connected to the AR displaying device 11. In this embodiment, the forehead pad 12 comprises a front cover 121, a front positioning plate 122, a front buckle 124 and a front cushion 123. The front cover 121 is made of hard material, and the lower end of the front cover 121 is fixed to the top edge of a rear side of the casing 111. The front positioning plate 122 is fixed to an inner side of the front cover 121, and a plurality of front ventilation holes are formed on the front positioning plate 122. The front buckle 124 is positioned in a top notch of the front positioning plate 122, and a top of the front buckle 124 is exposed outside a top edge of the forehead pad 12. The front cushion 123 is made of soft material and is fixed to the rear side of the front cover 121. The front positioning plate 122 is sandwiched between the front cushion 123 and the front cover 121.

The rear-head pad 13 comprises a rear cover 131, a rear positioning plate 132, a rear buckle 134, a rear cushion 133, and an adjusting mechanism 20. The rear cover 131 is made of hard material and has a shaft hole 1311. The rear positioning plate 132 is fixed to a front side of the rear cover 131, and a plurality of rear ventilation holes are formed on the rear positioning plate 132. The rear buckle 134 is located in a top notch of the rear positioning plate 132, and a top of the rear buckle 134 is exposed outside a top edge of the rear-head pad 13. The rear cushion 133 is made of soft material and is fixed to the front side of the rear cover 131, and the rear positioning plate 132 is sandwiched between the rear cushion 133 and the rear cover 131.

The left strap 14 is made of hard and flexible material, and is connected between a left end of the forehead pad 12 and a left end of the rear-head pad 13. A left slot 141 extending laterally is disposed in the area of the left strap 14 that is closer to the rear-head pad 13. The right strap 15 is made of hard and flexible material, and is connected between a right end of the forehead pad 12 and a right end of the rear-head pad 13. A right slot 151 extending laterally is disposed in the area of the right strap 15 that is closer to the rear-head pad 13. The upper strap 16 (also called as top strap) is made of flexible material such as soft plastic or non-woven fabric, and is connected between the front buckle 124 exposed on the top edge of the forehead pad 12 and the rear buckle 134 exposed on the top edge of the rear-head pad 13.

As shown in FIG. 4, FIG. 5A and FIG. 5B, the adjusting mechanism 20 comprises: a lower rack 21, an upper rack 22, a gear 23, and a knob 24. The lower rack 21 is disposed in one of the left slot 141 and the right slot 151, while the upper rack 21 is disposed in the other one of the left slot 141 and the right slot 151. The lower rack 21 and the upper rack 22 are located inside the rear-head pad 13 and between the rear cover 131 and the rear positioning plate 132. The gear 23 is located inside the rear-head pad 13, and is located between the rear cover 131 and the rear positioning plate 132, and is located in both the left slot 141 and the right slot 151, and is engaged with both the lower rack 21 and the upper rack 22. The gear 23 has a protruding shaft 231, the shaft 231 passes through the shaft hole 1311 of the rear cover 131 and protrudes out of the rear cover 131. The knob 24 is located outside the rear cover 131 and is fixed to the shaft 231 by means of screws or adhesives. When the knob 24 is rotated, the shaft 231 and the gear 23 can be driven to rotate synchronously, thereby driving the lower rack 21 and the upper rack 22 engaged with the gear 23 to move laterally; therefore, the left strap 14 and the right strap 15 are driven to perform either an inward shortening motion (as shown in FIG. 5A) or an outward extending motion (as shown in FIG. 5B).

In a preferred embodiment, the casing 111, the front cover 121, the front positioning plate 122, the rear cover 131, the rear positioning plate 132, the left strap 14, the right strap 15, the gears 23 and the knob 24 are all made of hard plastic. In this embodiment, the left and right straps 14, 15 can be made of either TPU (Thermoplastic Polyurethanes) or PP (Polypropylene). The upper strap 16 is made of soft plastic or non-woven fabric, and hook and loop fasteners (also called as Velcro) 161 are provided on the front and rear ends of the upper strap 16; such that, the front end and rear end of the upper strap 16 can pass through the front buckle 124 and the rear buckle 134 respectively and then be pasted and fixed by means of the hook and loop fasteners 161 thereon. The front end of the left strap 14 is combined with the left side of the front positioning plate 122, and the rear end of the left strap 14 is engaged with the gear 23 by one of the lower rack 21 or the upper rack 22. In the meantime, the front end of the right strap 15 is combined with the right side of the front positioning plate 122, and the rear end of the right strap 15 is engaged with the gear 23 by the other one of the lower rack 21 or the upper rack 22. Thereby, by rotating the knob 24 of the adjusting mechanism 20, the lengths of the left and right straps 14 and 15 of the AR head-mounted display 1 can be adjusted; in addition, the length of the upper strap 16 can be adjusted by tearing and re-sticking the hook and loop fasteners 161 in different locations, in order to adapt to different sizes of users' head circumferences.

In the present invention, a clip structure 1312 is further provided on a side portion of the rear cover 131 of the rear-head pad 13. A front end of the cable 17 is directly connected to a side surface of the casing 111 and is electrically connected to the optical display module 112. A rear end of the cable 17 extends to the rear-head pad 13 and is clamped on the clip structure 1312 of the rear cover 131 and then continues to extend downward. Wherein, except that the cable 17 is connected to the side surface of the casing 111 and the clip structure 1312 of the rear cover 131, the cable 17 is not connected nor fixed to any other component of the AR head-mounted display 1.

As shown in FIG. 6, when the AR head-mounted display 1 of the present invention is worn on the human head 91, the forehead pad 12 and the rear-head pad 13 are respectively abutted against and supported on a forehead portion and a rear head portion of the human head 91; in addition, the left strap 14, the right strap 15 and the upper strap 16 are respectively abutted on a left side, a right side and a top surface of the human head 91; and moreover, the casing 111 of the AR displaying device 11 does not touch the human head 91 at all. Therefore, even if used for a long time, the heat generated by the AR displaying device 11 is not directly transmitted to the skin of the user's head. Furthermore, since both ends of the left strap 14, the right strap 15 and the upper strap 16 are connected between the forehead pad 12 and the rear-head pad 13, these straps 14, 15 and 16 are not directly connected with the casing 111 of the AR displaying device 11; therefore, the tightening forces of these straps 14, 15 and 16 are only distributed to the cushioned forehead pad 12 and rear-head pad 13; the AR displaying device 11 will not be pulled by these straps 14, 15 and 16 at all, so that the hard surface of the casing 111 will not come into contact with the user's head to cause discomfort. The positions of the two transparent projection panels 113 are corresponding to the two eyes 92 of the human head 91. An X-axis extending horizontally is defined according to the centers of the two eyes 92 of the human head 91. Then, a Y-axis extending horizontally and a Z-axis extending vertically are defined according to the X-axis. The X-axis, the Y-axis and the Z-axis are perpendicular to each other. The plane defined by the X-axis and the Z-axis is called an XZ plane, the plane defined by the X-axis and the Y-axis is called an XY plane, and the plane defined by the Y-axis and the Z-axis is called a YZ plane. The two transparent projection panels 113 are substantially parallel to the XZ plane. The included angle between a tangent line defined by a center point A of a front surface of the front cover 121 on the YZ plane and the Z axis is θ1. The included angle between the tangent line defined by the center point B of the rear surface of the rear cover 131 on the YZ plane and the Z axis is θ2. The included angle between an extension line defined by the center point A of the front surface of the front cover 121 and the center point B of the rear surface of the rear cover 131 on the YZ plane and the Y axis is θ3. The distance in the Z-axis direction between the center point A of the front surface of the front cover 121 and the center point B of the rear surface of the rear cover 131 on the YZ plane is h. The distance in the Y-axis direction between the two transparent projection panels 113 and the surfaces of the two eyes 92 of the human head 91 on the YZ plane is d. Wherein, $30° \leq \theta1 \leq 45°$; $10° \leq \theta2 \leq 20°$; $20° \leq \theta3 \leq 30°$; $65 \text{ mm} \leq h \leq 105 \text{ mm}$; $15 \text{ mm} \leq d \leq 25 \text{ mm}$. In addition, the two transparent projection panels 113, the two eyes 92 of the wearer's head 91, and the center point B of the rear surface of the rear cover 131 are all located at substantially the same height; that is, about the same height in the Z-axis direction. Such a structural design enables the AR head-mounted display 1 of the present invention to be suitable for being worn and used in a head-down (looking downward) posture. No matter whether the wearer is in a straight-up or head-down position, this novel head-mount design can always be ergonomically and stably held on the wearer's head; there will be no loosening nor displacement even if the wearer's head is lowered for a long time, which is especially suitable for surgeons to wear to perform endoscopic surgery. Moreover, the width of the forehead pad 12 in the X-axis direction of the AR head-mounted display 1 of the present invention ranges from 140 mm to 170 mm; the height of the forehead pad 12 in the Z-axis direction is between 35 mm and 60 mm; the thickness of the forehead pad 12 in the Y-axis direction (thickness at the center point A) is between 8 mm and 18 mm. Furthermore, for the forehead pad 13, the width in the X-axis direction is between 140 mm and 170 mm; the height in the Z-axis direction is between 25 mm and 40 mm; the thickness in the Y-axis direction (the thickness at the center point B, not counting the thickness of the knob 24) is between 13 mm and 25 mm. This size of the AR head-mounted display 1 provides a stable and comfortable fit for the surgeons to wear.

As shown in FIG. 7, when performing endoscopic surgery, the surgeon can wear the AR head-mounted display 1 of the present invention on his/her head, and then plug the rear end of the cable 17 to an image processing host 93. When the surgeon operates the endoscope 94 and other surgical instruments (not shown), the images of tissues or organs in the patient's body captured by the endoscope 94 can be transmitted to the AR head-mounted display 1 of the present invention through the image processing host 93, and projected and displayed on the two transparent projection panels 113 by the optical display module 112. Such that, the surgeon can watch the images of patient's internal tissues or organs in the form of AR, and thereby can perform endoscopic surgery more conveniently and accurately. In order to avoid the image delay (lag) phenomenon affecting the success rate of surgery, the AR head-mounted display 1 of the present invention uses the cable 17 to connect to the image processing host 93 in a wired manner for transmitting image signals. Since the surgeon must move around in the operating room, the length of the cable 17 needs to be at least 5 m (five meter) or even more than 6 m. Generally speaking, such a long cable 17 may not only pull the AR displaying device 11 due to its weight, causing it to tilt or shift, but also hinder the surgeon's operation. Therefore, the cable 17 of the AR head-mounted display 1 of the present invention extends from the side surface of the casing 111 to the rear-head pad 13, and is clamped on the clip structure 1312 of the rear cover 131, and then continue to extend down from the surgeon's back. Wherein, except for the side surface of the casing 111 and the clip structure 1312 of the rear cover 131, the cable 17 is not bonded nor connected to any other component of the AR head-mounted display 1. With this novel design, the weight of the cable 17 or the pulling force of the cable 17 when the wearer walks will be absorbed by the rear-head pad 13, the weight or pulling force of the cable 17 will not cause any tilt or offset of the AR displaying device 11 located at the front end of the AR head-mounted display 1. Because the cable 17 extends downward from the back of the wearer's head along the wearer's back, the cable 17 will never affect or hinder the surgical operation of the surgeon whether it is in the process of operation or walking. Moreover, during the endoscopic surgery, the surgeon will need to lower the head for a long time to perform the operation. The AR head-mounted display 1 of the present invention uses the above-mentioned novel structural design, including: 30°≤θ1≤45°, 10°≤θ2≤20°, 20°≤θ3≤30°, 65 mm≤h≤105 mm, 15 mm≤d≤25 mm, and the heights of the two transparent projection panels 113, the two eyes 92 of the human head 91, and the center point B of the rear surface of the rear cover 131 in the Z-axis direction are approximately the same; which makes the weight of the AR displaying device 11 to be properly supported by the forehead pad 12 and the rear-head pad 13 even when the wearer is in a bowing posture with the head tilted forward at an angle of about 20° to 50° for a long time, in the meantime, the rear-head pad 13 can still stick to its original position stably, and it is not easy to loosen or shift.

While the present invention has been particularly shown and described with reference to a preferred embodiment, it will be understood by those skilled in the art that various changes in form and detail may be without departing from the spirit and scope of the present invention.

What is claimed is:

1. An augmented reality head-mounted display, comprising:
    an augmented reality (AR) displaying device, said AR displaying device comprising: a casing, an optical display module, two transparent projection panels and a dark transparent cover; the optical display module being accommodated in the casing for projecting images; said casing being made of hard material; the two transparent projection panels extending downward from a bottom surface of the casing, such that the images projected by the optical display module can be displayed on the two transparent projection panels; the dark transparent cover extending downward from a bottom edge of a front side of the casing to a location lower than bottom edges of the two transparent projection panels and being separated from the two transparent projection panels by a distance;
    a forehead pad, connected to the AR displaying device; the forehead pad comprising a front cover, a front positioning plate, a front buckle and a front cushion; the front cover being made of hard material; a lower end of the front cover being fixed to a top edge of a rear side of the casing; the front positioning plate being fixed to an inner side of the front cover; a plurality of front ventilation holes being formed on the front positioning plate; the front buckle being positioned in a top notch of the front positioning plate; a top of the front buckle being exposed outside a top edge of the forehead pad; the front cushion being made of soft material and fixed to a rear side of the front cover; the front positioning plate being sandwiched between the front cushion and the front cover;
    a rear-head pad, comprising a rear cover, a rear positioning plate, a rear buckle, a rear cushion, and an adjusting mechanism; the rear cover being made of hard material and having a shaft hole; the rear positioning plate being fixed to a front side of the rear cover; a plurality of rear ventilation holes being formed on the rear positioning plate; the rear buckle being located in a top notch of the rear positioning plate; a top of the rear buckle being exposed outside a top edge of the rear-head pad; the rear cushion being made of soft material and fixed to the front side of the rear cover; the rear positioning plate being sandwiched between the rear cushion and the rear cover;
    a left strap, being made of hard and flexible material, and connected between a left end of the forehead pad and a left end of the rear-head pad; a left slot extending laterally being disposed in an area of the left strap that is closer to the rear-head pad;
    a right strap, being made of hard and flexible material, and connected between a right end of the forehead pad and a right end of the rear-head pad; a right slot extending laterally being disposed in an area of the right strap that is closer to the rear-head pad; and
    an upper strap, being made of flexible material and connected between the front buckle exposed on the top edge of the forehead pad and the rear buckle exposed on the top edge of the rear-head pad;
    wherein the adjusting mechanism comprises: a lower rack, an upper rack, a gear, and a knob; the lower rack is disposed in one of the left slot and the right slot, while the upper rack is disposed in the other one of the left slot and the right slot; the lower rack and the upper rack are located inside the rear-head pad and between the rear cover and the rear positioning plate; the gear is located inside the rear-head pad, and is located between the rear cover and the rear positioning plate, and is located in both the left slot and the right slot, and is engaged with both the lower rack and the upper rack; the gear has a protruding shaft, the shaft passes through the shaft hole of the rear cover and protrudes out of the rear cover; the knob is located outside the rear cover and is fixed to the shaft; when the knob is rotated, the shaft and the gear can be driven to rotate synchronously, thereby driving the lower rack and the upper rack engaged with the gear to move laterally; such that, the left strap and the right strap are driven to perform either an inward shortening motion or an outward extending motion;
    wherein, the casing, the front cover, the front positioning plate, the rear cover, the rear positioning plate, the left strap, the right strap, the gears and the knob are all made of hard plastic; the upper strap is made of either soft plastic or non-woven fabric, and hook and loop fasteners are provided on front and rear ends of the upper strap; such that, the front end and rear end of the upper strap can pass through the front buckle and the rear buckle respectively and then be pasted and fixed by means of the hook and loop fasteners thereon; a front end of the left strap is combined with a left side of the front positioning plate, and a rear end of the left strap is engaged with the gear by one of the lower rack or the upper rack; a front end of the right strap is combined with a right side of the front positioning plate, and a rear end of the right strap is engaged with the gear by the other one of the lower rack or the upper rack;
    wherein, the augmented reality head-mounted display further comprises a connecting cable; wherein, a clip structure is further provided on a side portion of the rear cover of the rear-head pad: a front end of the cable is connected to a side surface of the casing and is electrically connected to the optical display module; a rear end of the cable extends to the rear-head pad and is clamped on the clip structure of the rear cover and then continues to extend downward; wherein, except that the cable is connected to the side surface of the casing and the clip structure of the rear cover, the cable is not connected to any other component of the augmented reality head-mounted display.

2. The augmented reality head-mounted display of claim 1, wherein, when the augmented reality head-mounted display is adapted to be worn on a human head, the forehead pad and the rear-head pad are adapted to be respectively abutted against and supported on a forehead portion and a rear-head portion of the human head; in addition, the left strap, the right strap and the upper strap are adapted to be respectively abutted on a left side, a right side and a top surface of the human head; and moreover, the casing of the augmented reality displaying device does not touch the human head at all.

3. The augmented reality head-mounted display of claim 2, wherein, when the augmented reality head-mounted display is adapted to be worn on the human head, an X-axis extending horizontally is defined according to centers of two eyes of the human head; a Y-axis extending horizontally and a Z-axis extending vertically are defined according to the X-axis; the X-axis, the Y-axis and the Z-axis are perpendicular to each other; a first plane defined by the X-axis and the Z-axis is called an XZ plane, a second plane defined by the X-axis and the Y-axis is called an XY plane, and a third plane defined by the Y-axis and the Z-axis is called a YZ plane; the two transparent projection panels are substantially parallel to the XZ plane; a first included angle between a tangent line defined by a center point A of a front surface of the front cover on the YZ plane and the Z axis is $\theta 1$; a second included angle between the tangent line defined by a center point B of a rear surface of the rear cover on the YZ plane and the Z axis is $\theta 2$; a third included angle between an extension line defined by the center point A of the front surface of the front cover and the center point B of the rear surface of the rear cover on the YZ plane and the Y axis is $\theta 3$; a first distance in the Z-axis direction between the center point A of the front surface of the front cover and the center point B of the rear surface of the rear cover on the YZ plane is h; a second distance in the Y-axis direction between the two transparent projection panels and surfaces of the two eyes of the human head on the YZ plane is d; wherein, $30°\leq\theta1\leq45°$; $10°\leq\theta2\leq20°$; $20°\leq\theta3\leq30°$; 65 mm$\leq$h$\leq$105 mm; 15 mm$\leq$d$\leq$25 mm.

4. The augmented reality head-mounted display of claim 3, wherein, when the augmented reality head-mounted display is adapted to be worn on the human head, the two transparent projection panels, the two eyes of the human head, and the center point B of the rear surface of the rear cover are substantially located at the same height in the Z-axis direction.

* * * * *